US005574446A

United States Patent [19]

Dittrich et al.

[11] Patent Number: 5,574,446

[45] Date of Patent: Nov. 12, 1996

[54] KEYBOARD

[75] Inventors: Jörg Dittrich, Ammertal; Günter Greiner, Bayreuth; Karl-Heinz Müller, Auerbach; Klaus Schuster, Bayreuth; Günter Murmann, Pegnitz; Kurt Michel, Roth, all of Germany

[73] Assignee: Cherry Mikroschalter GmbH, Auerbach, Germany

[21] Appl. No.: 397,477

[22] Filed: Mar. 2, 1995

[30] Foreign Application Priority Data

| | | | |
|---|---|---|---|
| Mar. 11, 1994 | [DE] | Germany | 44 08 331.9 |
| Nov. 25, 1994 | [DE] | Germany | 44 42 073.0 |

[51] Int. Cl.$^{6}$ ........................ H03K 17/94; H03M 11/100

[52] U.S. Cl. ........................ 341/22; 341/20; 345/168; 400/681

[58] Field of Search ........................ 341/20, 22; 345/168, 345/169; 400/681, 472, 488, 682; 200/5 A

[56] References Cited

U.S. PATENT DOCUMENTS

| | | | |
|---|---|---|---|
| 4,029,916 | 1/1977 | Chu | 200/1 |
| 4,354,068 | 10/1982 | Sobol, III | 200/5 |
| 4,560,844 | 12/1985 | Takamura et al. | 200/5 |
| 4,592,528 | 6/1986 | Still | 248/359 |
| 4,658,124 | 4/1987 | Bertina | 400/682 |
| 4,735,394 | 4/1988 | Facco | 248/653 |
| 4,856,748 | 8/1989 | Obermeyer | 400/681 |
| 5,203,448 | 4/1993 | Osada et al. | 200/5 A |
| 5,278,557 | 1/1994 | Stokes et al. | 341/34 |
| 5,297,003 | 3/1994 | Nomura et al. | 400/681 |
| 5,438,177 | 8/1995 | Fagan | 200/5 A |

*Primary Examiner*—Jeffery Hofsass
*Assistant Examiner*—Timothy Edwards, Jr.
*Attorney, Agent, or Firm*—Klaus J. Bach

[57] ABSTRACT

In a keyboard housing a housing top with a key pad and a housing bottom with support legs wherein the housing includes a support mat and a multi-layer contact foil set arranged underneath the key pad to be actuated thereby, a metal plate is embedded in a recess formed in the housing bottom below the contact foil set so as to increase weight and rigidity of the housing without the need for special molded housing reinforcement structures, the housing bottom, however, having U-shaped reinforcement web structures with bearing studs at their base areas near the housing bottom and housing legs with bearing holes receiving the bearing studs so as to be pivotally supported thereby, the housing legs having locking grooves and the housing bottom having, between the web structures, engagement tongues with locking ribs for engagement with the locking grooves in the housing legs.

9 Claims, 8 Drawing Sheets

KEYBOARD

BACKGROUND OF THE INVENTION

The invention resides in keyboards containing contact pads and contact foils and particularly such keyboards which are highly skid-, bend-, and twist-resistant.

In order to make the bottom structure of keyboards more bend and twist resistant, it is known to reinforce the bottom plate, which normally consists of injection molded plastic material, with reinforcement structures such as ribs or stiffening corrugations.

Moder keyboards as they are used, for example for personal computers have become very compact and lightweight because of the use of compact, highly efficient components.

In the past it has been practice to provide for each key a return spring and an involved return mechanism but today so-called key support mats of elastomeric material are used which, below the keys, have dome-shaped raised portions (so-called key domes) which are impressed upon actuation of a key in order to provide the required return force for the key. Furthermore, instead of the conductor plates used in keyboards in the past, the multilayer contact foil sets which include electrical contacts and conductors and which are used in today's keyboards, are much lighter.

The weight loss of such keyboards which comes with the use of such lightweight designs and materials is now such that it has become annoying to the keyboard operator since the keyboards often have only small support contact forces and consequently have a relatively small stability with respect to unintended skidding on their support surface. In addition, the lighter components result in a reduction of the bend and twist resistance of the whole keyboard.

In order to provide the keyboards with greater bend and twist resistance, it is known to reinforce the bottom plates, which generally consist of injection molded plastic material, with ribs or corrugations as disclosed, for example, in German patent application P 44 08 3319. This however leads to a housing geometry of substantially increased complexity which also requires complex injection molds which furthermore make it more difficult to remove the injection-molded parts from the molds.

It is further known to provide keyboards with legs which are mounted by means of beating structures disposed separately on the bottom plate of the keyboard.

It is the object of the present invention to provide a keyboard with a key support mat and a multi-layer contact foil set wherein, however the housing is simple in shape so that it can be easily injection molded but, by inclusion of the housing legs into the bottom plate the bend and twist resistance and also the stability of the keyboard is increased whereas assembly of the keyboard components remains simple.

SUMMARY OF THE INVENTION

In a keyboard housing, a housing top with a key pad and a housing bottom with support legs wherein the housing includes a key support mat and a multi-layer contact foil set arranged underneath the key pad to be actuated thereby, wherein a metal plate is embedded in a recess formed in the housing bottom below the contact foil set so as to increase weight and rigidity of the housing without the need for special molded housing reinforcement structures, the housing bottom however having U-shaped reinforcement web structures with bearing studs at their base areas near the housing bottom and housing legs with bearing holes receiving the bearing studs so as to be pivotally supported thereby, the housing legs having locking grooves and the housing bottom having, between the web structures, engagement tongues with locking ribs for engagement with the locking grove locking the legs.

In the keyboard, according to the present invention, a metal plate is embedded in a recess in the bottom plate of the keyboard housing below the lowermost foil of the contact foil set such that it is firmly engaged between the deformable key support mat and the housing bottom plate. This increases the rigidity and weight of the keyboard housing in a simple manner. The rigidity is further increased by the leg support arrangement, integrally formed with the housing bottom plate.

In an embodiment of the invention, the multi-layer contact foil set is provided with one or several openings through each of which a holding element extends which may be formed integrally with the key support mat and is disposed on the upper surface of the metal plate (first embodiment) or on the lowermost layer of the contact foil (second embodiment). The upper housing portion of the keyboard is provided at its inner surface with ribs, of which, at least some are disposed on the top surface of the holding elements. In this manner, the key support mat is held down by the holding elements in engagement with the metal plate disposed underneath, whereby the metal plate is held in position and the foil set is supported in an essentially floating manner.

Other unfavorable ways of fixing the metal plate which, in practice, particularly screwing the metal plate to the bottom plate (which is undesirable for cost reasons), or the tolerance-free assembly of the components of the bottom plate, that is, the metal plate and the ribbed housing top parts, which are in contact with each other without interposition of the deformable key support mat, are avoided.

In a variation of the second embodiment of the keyboard according to the invention, the underside of the lowermost contact foil is provided with conductor strips and/or contact points which are in electrical contact with the metal plate beneath, onto which this lowermost contact foil is pressed, thereby improving the electromagnetic shielding.

Furthermore, at least some of the ribs at the inside of the housing top part are engaged by locking elements formed on the bottom plate whereby the upper housing half can be firmly connected to, and interlocked with, the lower housing half.

The keyboard, according to the invention, has at the bottom of the housing, pivotable housing legs which are supported on U-shaped reinforcement webs provided at their ends remote from the keyboard, with a support surface. A socket section adjacent the bottom plate receives the bearing pins for the pivotable housing legs.

Two or more of these U-shaped reinforcement web structures include housing legs which are supported by means of bearing studs integrally molded with the reinforcement webs and extending into bearing cavities formed in the legs.

The pivotable housing legs have, at their ends opposite the bearing cavities, a rounded rest area and are pivotable between two end positions over an angle of at least 90°and they are lockable in these end positions by suitable locking means. Shape and size of the housing legs are adjusted to the reinforcement webs so that, in one end position of the legs, no part of the legs projects from the housing bottom further than the support surface of the reinforcement webs. At the same time, a part of the support area is disposed in the same plane as the support surface of the webs. When flipped down, the housing legs project from the support surfaces of the reinforcement webs. With the two end portions of the legs, two different inclinations can be provided for the keyboard which gives the operator a choice for the most suitable inclination for individual use of the keyboard. The pivotable housing legs may be provided with a skid-resistant bead which may be arranged in such a manner, that it forms part of the support base in either of the two end positions of the housing legs. Together, with skid-resistant projections at the bottom front end (the end adjacent the operator) they form a stable keyboard support.

Adjacent the reinforcement webs which are provided with pivotable housing legs, there may be provided several rib-like webs which project from the bottom plate but which do not project down to the plane as defined by the support surfaces of the reinforcement webs. These ribs serve, on one hand, as additional reinforcement elements and, on the other hand, they provide a rest for the fingers of an operator when pivoting the housing legs.

The advantages and features of the present invention will become more readily apparent from the following description of an embodiment thereof shown, by way of example only, in the accompanying drawings.

DESCRIPTION OF A PREFERRED EMBODIMENT

Figure 1:
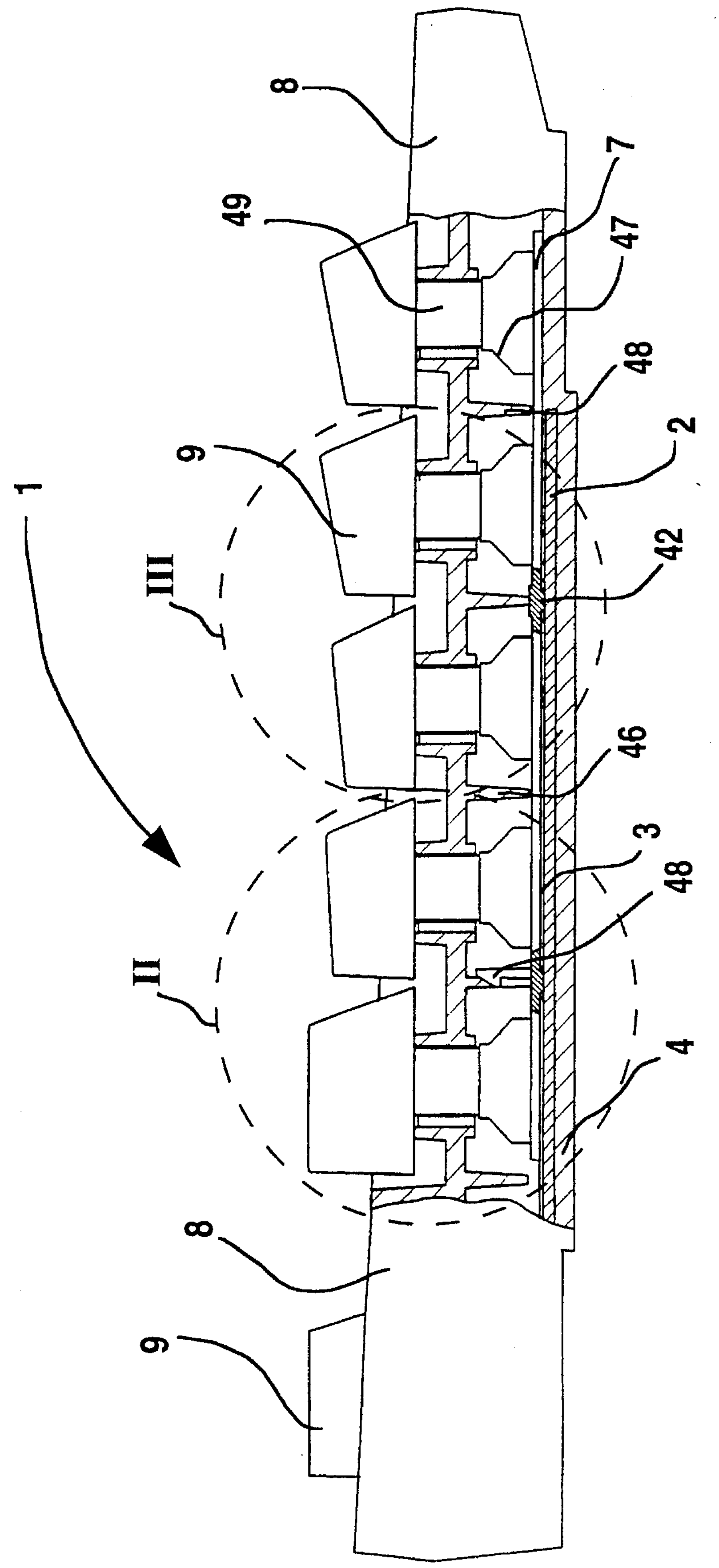
FIG. 1 is a partial cross-sectional view of the keyboard with the metal plate installed.

FIG. 1 is a partial cross-sectional view of the keyboard 1 according to the invention which has a metal plate 2 fitted into a recess in the bottom plate 4. A multi-layer contact foil set 3 is disposed on top of the metal plate 2. The keyboard 1 includes a housing top 8 on which vertically movable keys 9 are slidably supported. On their underside, the keys 9 are provided with pins 49 which are disposed on support domes 47 formed integrally on the upper side of a support mat 7 of elastomeric material.

The support mat 7 is disposed on top of the uppermost contact foil of the contact foil set 3. The multi-layer contact foil set 3 is provided with several openings through which holding elements 42 extend which are integral with the support mat 7. At its inside, the housing top 8 is provided with downwardly projecting reinforcement ribs 46 of which at least some are disposed on the holding elements 42 and consequently help locating the support mat 7. The support mat 7 and/or holding elements 42 are deformable and serve as a clearance compensation structure between the rigid metal plate 2 and the rigid reinforcement ribs 46.

Figure 2:
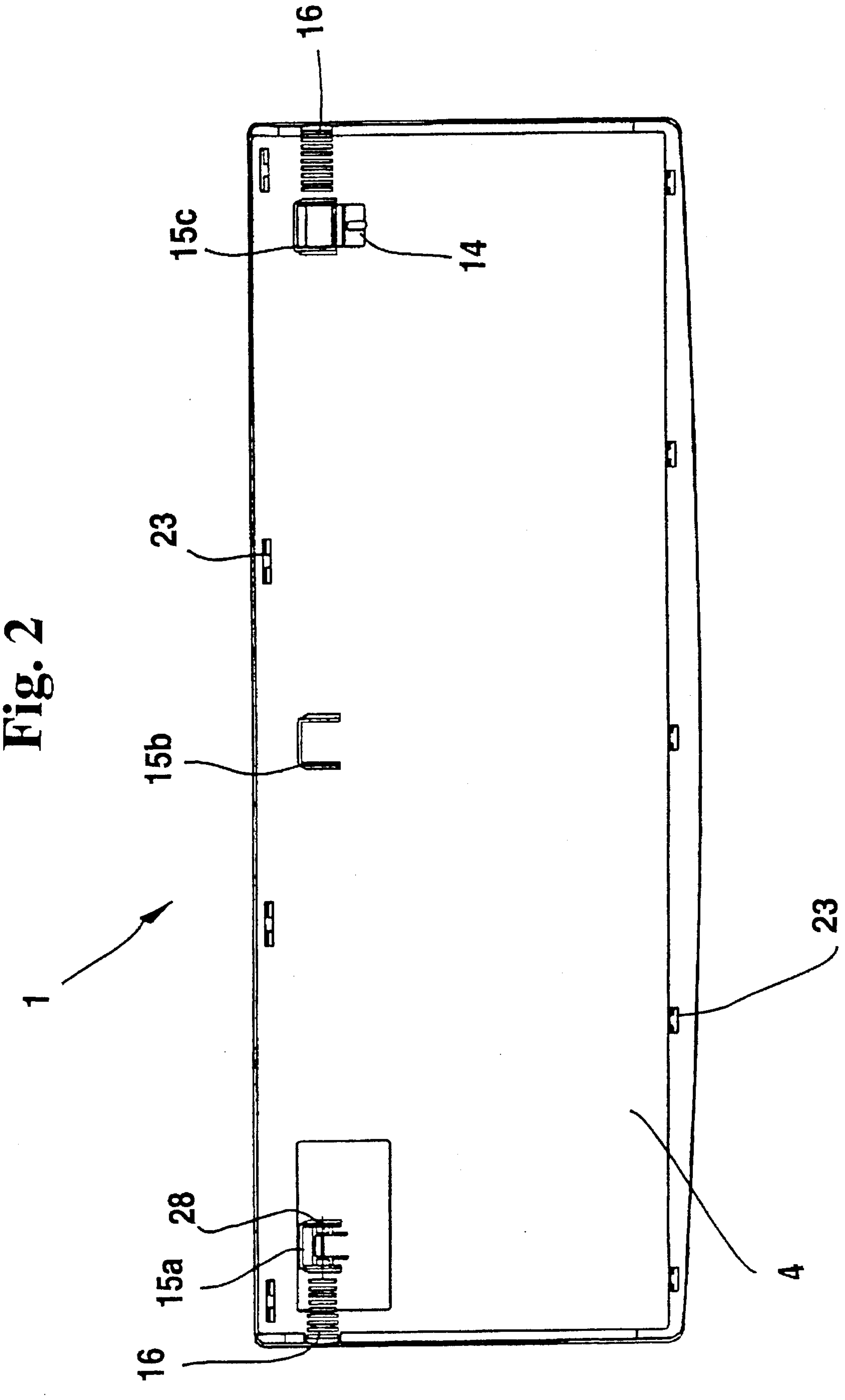
FIG. 2 is a bottom view of the bottom plate of the keyboard.
Figure 3:
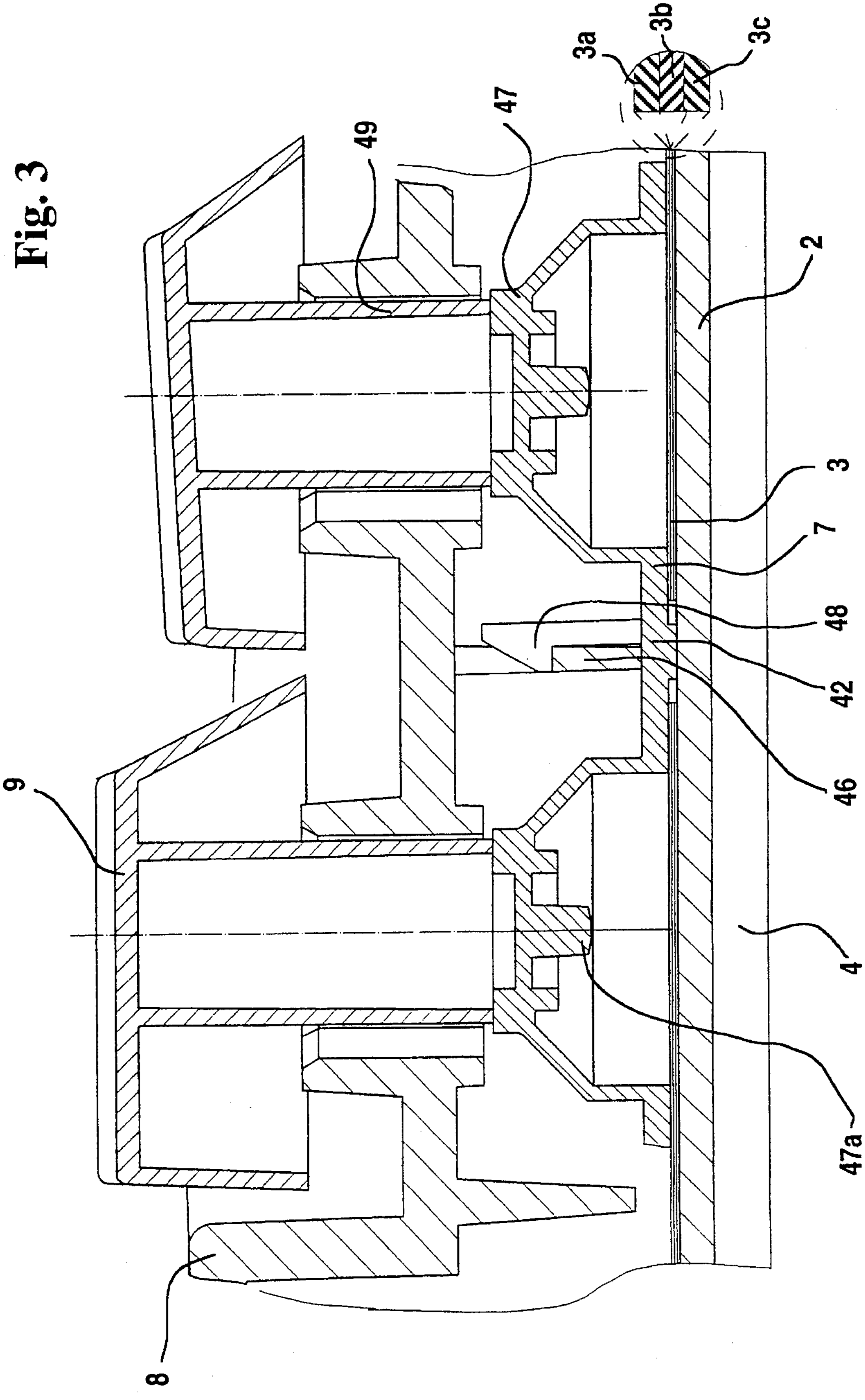
FIG. 3 is a partial sectional view of FIG. 1 showing the area encircled by dashed line II.

FIG. 2 shows the bottom plate 4 of the keyboard 1. The underside of this bottom plate 4 includes several reinforcement webs 15*a*, 15*b* and 15*e* which, in the plane view shown, have a U-shaped configuration. They are formed integrally with the bottom plate by injection molding and have pivotable housing legs 14 (FIGS.7–9) supported theron by bearing studs 28. The bearing studs 28 are disposed at the base area 36 (FIG.6) of the reinforcement webs. The reinforcement webs 15*a*, 15*b* and 15*c* are provided preferably near the rear end of the bottom plate 4 (when the keyboard is in normal operative position, that is, disposed with its bottom plate on a support surface in from of an operator). Next to these reinforcement webs 15*a*, 15*b* and 15*c*, there may be provided ribs 16 which preferably extend parallel to the side edges of the bottom plate 4 at one side of the reinforcement webs 15*a*, 15*c*. They serve as grip structures for the fingers of an operator as will be explained later. The bottom plate 4 is connected to the housing top of the keyboard 1 by means of snap-lock connections 23. FIG. 3 is an enlarged partial sectional view of an area encircled in FIG. 1 by a dashed line II showing the metal plate 2. The operating pins 49 formed on the underside of the vertically movable keys 9 which are slidably supported in the housing top 8 are disposed on the support domes 47. Pressure on a key 9 causes the support domes underneath to collapse, whereupon the downwardly extending dome projections 47*a* engage the contact foil 3*a* underneath, which, like the lowermost contact foil 3*c*, carries at its inner side electrically conductive strips providing contact points directly below the dome projections 47*a*.

Between the two outer contact foils 3*a*, 3*c* there is a so-called spacer foil 3*b*which maintains the two outer foils at a predetermined distance from each other such that they are disposed in electrically insulated relationship. In the areas of the pressure points where the downward projections 47*a* engage the upper foil 3*a*, the spacer foil 3*b* has openings (which are not visible in FIGS. 1, 3 and 4 because of the size ratio). When the projection 47*a* presses onto the upper contact foil 3*a*, a contact point disposed on the contact foil below the projection 47*a* is pressed through the opening in the spacer foil 3*b* onto an electrical contact point disposed below on the contact foil 3*c* so that electrical contact is established between the two contact foils 3*a*, 3*c* at this point. When the key 9 is released, the return forces inherent in the elastomeric material of t key 9 to their original positions. Because of the return forces inherent in the spacer foil 3*b*, the upper contact foil 3*a* and the lower contact foil 3*c* are also returned to their original positions in which they are separated and electrically insulated from each other.

It is known from practical experience that the contact foil set should be supported in a floating manner in order to prevent stresses caused by position changes and by temperature and humidity changes. Such stresses could lead to changes in the key operating path length and possibly even to short circuits.

In order to achieve such a floating support for the contact foils, the spacer foil set 3 has formed therein openings as shown in the enlarged partial sectional view of FIG. 3. The openings are arranged between the various keys 9 and the openings in the spacer foil 3*b* for the associated contact foil contact points.

Holding elements 42 which are formed integrally with the support mat 7 are disposed in these openings and extend therethrough and about the metal plate 2 disposed below the contact foil 3*c*. In this manner, the foil set 3 is prevented from sideward movement. This stabilization can be increased if, as shown in FIG. 3, the reinforcement ribs 46 formed on the housing top 8 engage the holding elements 42 and force them toward the metal plate 2 in the area where the holding elements 42 extended through the contact foil set 3*a* to 3*c*. A particularly stable arrangement of the support mat 7 and an advantageous increase of the bending and twisting resistance of the housing can be achieved if the reinforcement ribs 46 are interlockable with corresponding locking elements 48 projecting from the bottom plate 4.

Figure 4:
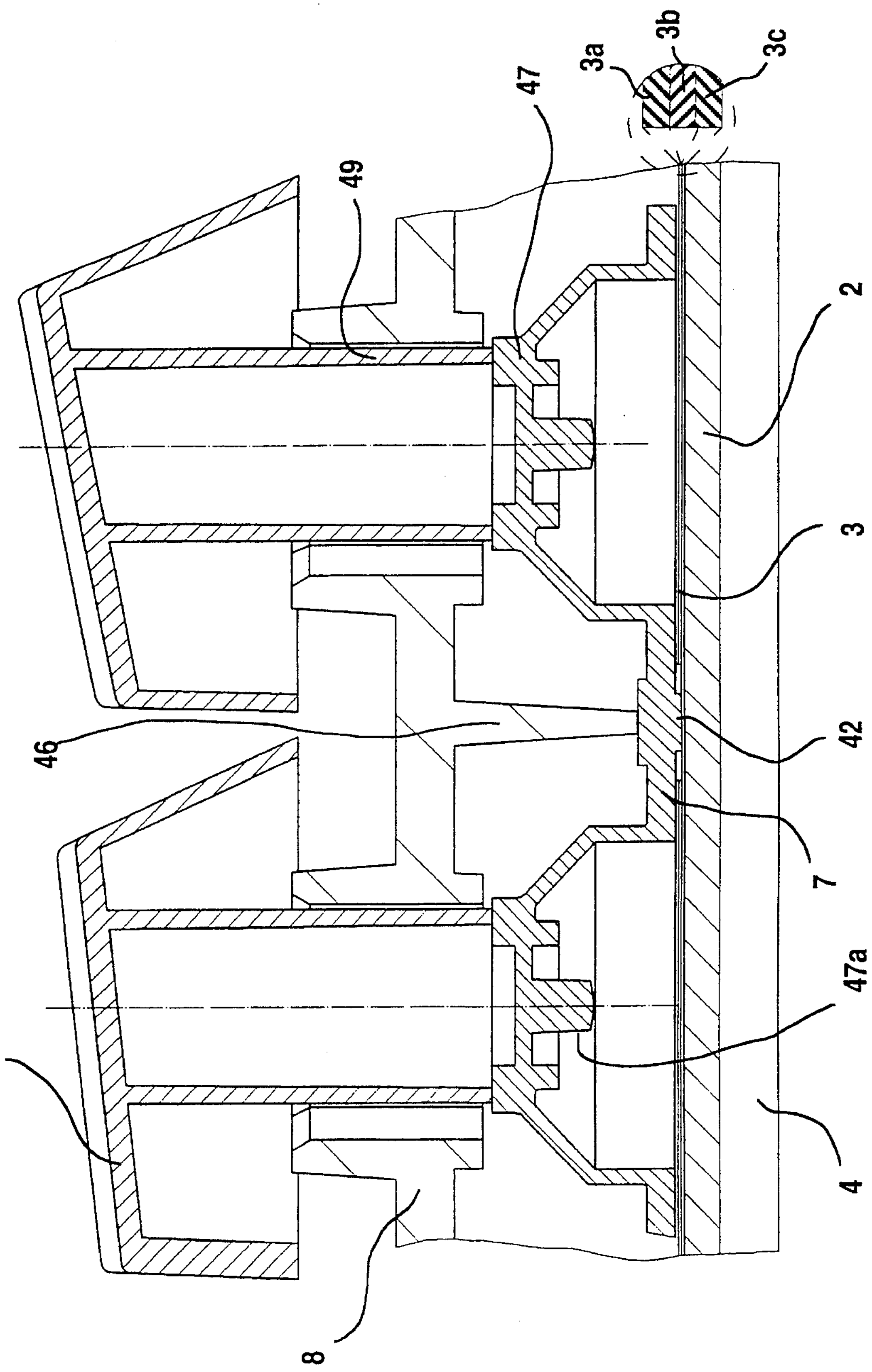
FIG. 4 is a partial sectional view of FIG. 1 showing the area encircled by dashed line III.

FIG. 4 is a partial sectional view of a portion of FIG. 1 which is encircled by a dashed line III showing the metal plate 2 embedded in the keyboard. Other than in the arrangement as shown in FIG. 3 wherein the openings in the foil set 3 extend through all the foils, the openings in the area of the holding elements 42 are formed only in the upper contact foil 3*a* and the spacer foil 3*b* but not in the lower contact foil 3*c* whereby the lower contact foil 3*c* is firmly engaged with the metal plate 2 by the holding elements 42.

Engagement of the lower contact foil 3*c* with the metal plate 2 provides for another advantage if on the lower side of the lower contact foil 3*c* opposite the contact structure, there are additional conductive strips or contact points. It has been found in practice that this results in an increased electromagnetic shielding, that is, an increased electromagnetic compatibility. The conductive strips or the contact points on the underside of the contact foil 3*c* are firmly pressed by the holding elements 42 onto the metal plate 2 at the predetermined locations, thereby insuring electrical contact with the metal plate 2 which improves the shielding.

Figure 5:
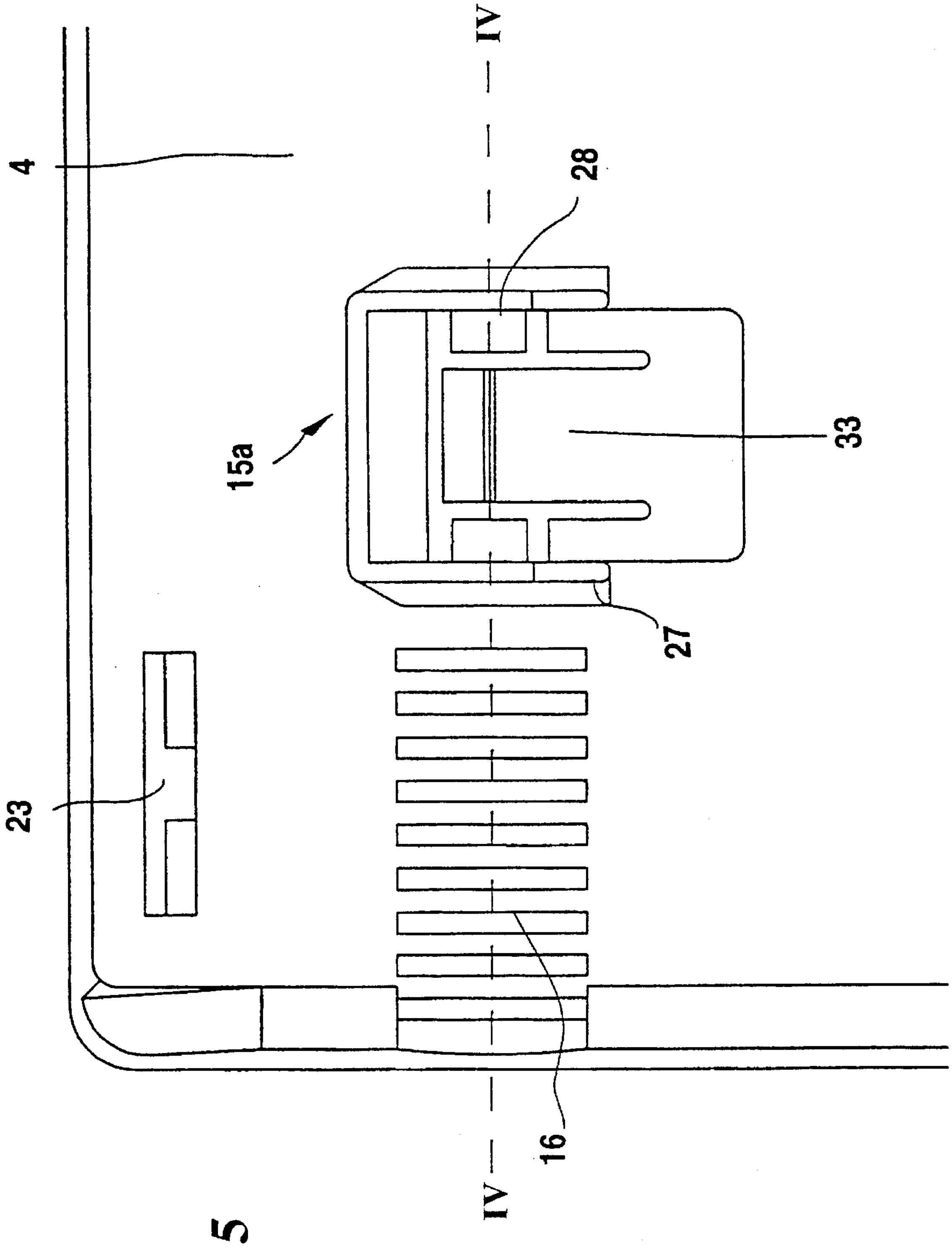
FIG. 5 is an enlarged view of a portion of the housing bottom plate in the area of a leg support structure.

FIG. 5 is an enlarged view of a portion of the housing bottom plate in the area of the reinforcement web 15*a* which is shown in FIG. 2 at the left side and which includes bearing stud 28 for pivotally supporting the housing legs 14 (shown in FIG. 2 adjacent the reinforcement web 5*c*) and locking tabs 33 disposed essentially in the plane of the bottom plate 4 and a support surface 27 projecting from the bottom plate 4.

Figure 6:
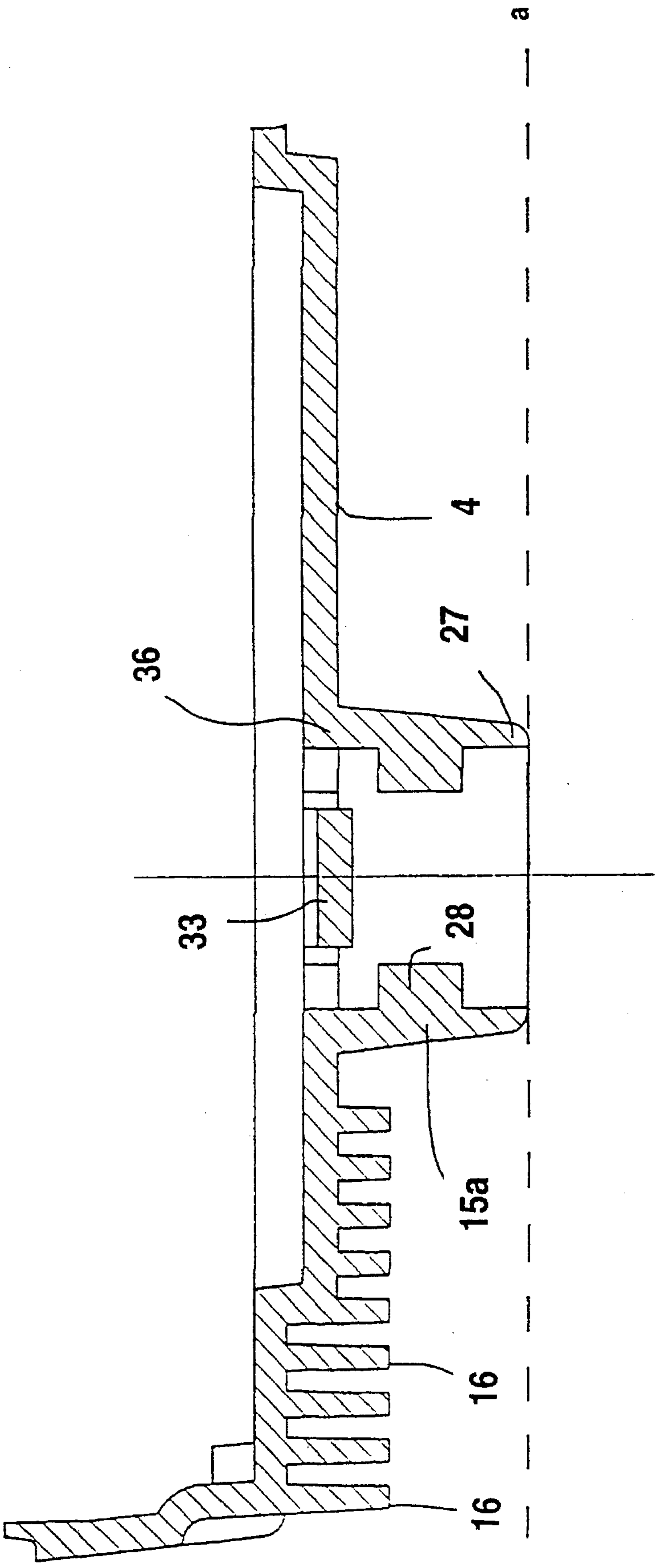
FIG. 6 is a cross-sectional view taken along line VI—VI of FIG. 5.

FIG. 6 is a cross-sectional view taken along line IV—IV of FIG. 5 showing the reinforcement webs 15*a* adjacent the edges of the bottom plate 4 Ribs 16 are formed on the bottom plate 4 between the reinforcement webs 15*a*, 15*c* and the edge of the bottom plate 4. They further increase the rigidity and bending resistance of the bottom plate but they do not project as far as the reinforcement webs 15*a*, 15*b* and 15*c*.

The size and shape of the housing legs (not shown in FIG. 6) are selected with respect to the reinforcement webs 15*a*, 15*b* and 15*c* so that, in their upwardly pivoted positions they do not extend beyond the reinforcement webs. Consequently, with upwardly pivoted legs, the bottom plate 4 of the keyboard is supported with the support faces of the reinforcement webs disposed on the support surface indicated by dashed line a. Since there is a space between the ribs 16 and the support surface a, the operator can, with one finger reaching behind the ribs 16 and one finger under the ribs, that is, between the ribs 16 and the support surface a, pivot the housing leg received between, and supported by, the reinforcement webs 15*a* and 15*c*.

Figure 7:
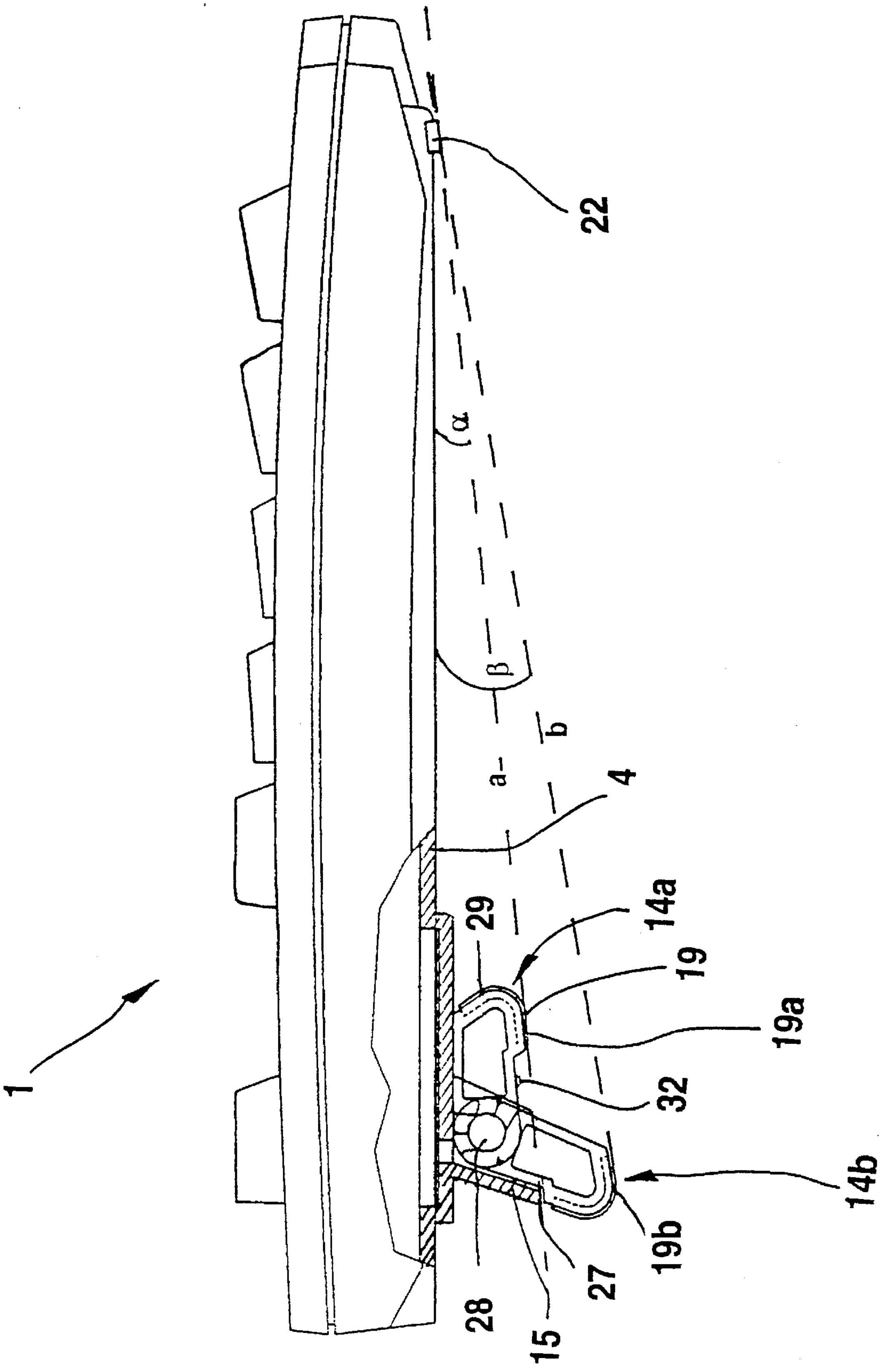
FIG. 7 is a side view of the keyboard with a cross-sectional view of the reinforcement web structure showing also a housing leg in a retracted and also in a downwardly flipped position.

FIG. 7 is a side view of the keyboard I and includes a sectional view of the reinforcement web 15*a* in order to show a housing leg in an upwardly pivoted position 14*a* and also in a downwardly pivoted position 14*b*. For both positions, the respective possible orientation of the support surface relative to the keyboard are indicated by dashed lines a and b and the inclination angles a and β.

The inclination angles a and βare determined by the front end of the keyboard 1 adjacent an operator which is provided with a skid-resistant insert 22 with which it rests on the support surface and the position of the housing legs 14*a* or 14*b*. The housing legs are supported between the support webs by bearing studs 28 and they are pivotable between the two end positions 14*a* and 14*b*.

The housing leg has, at its free end opposite the bearing stud 28, a slightly rounded support surface 29 which is provided with a skid resistant bead 19 disposed, for example, in a groove extending about the support surface 29. Size and shape of the housing leg and of the skid resistant bead 19 are so selected with regard to the reinforcement webs that the housing legs 14 will not project beyond the support surface a as defined by the reinforcement webs 15 and the skid resistant insert 22 of the housing. The portion 19*a* of this skid-resistant bead is disposed in the plane of the support surface a. Because the reinforcement webs 15 and also the legs 14 in their upwardly pivoted end positions project somewhat from the bottom plate 4, the keyboard 1 is somewhat inclined toward the operator even when the legs are pivoted upwardly such that an inclination angle α is formed and, further the keyboard is supported in a skid-resistant manner by engagement of the section 19*a* of the skid-resistant beads 19 with the support surface a.

If the housing leg is pivoted about the bearing stud 28 by an angle of at least 90° into its downward end position, the inclination of the keyboard with respect to the soobtained new support plane is given by the angle β.

Figure 8:
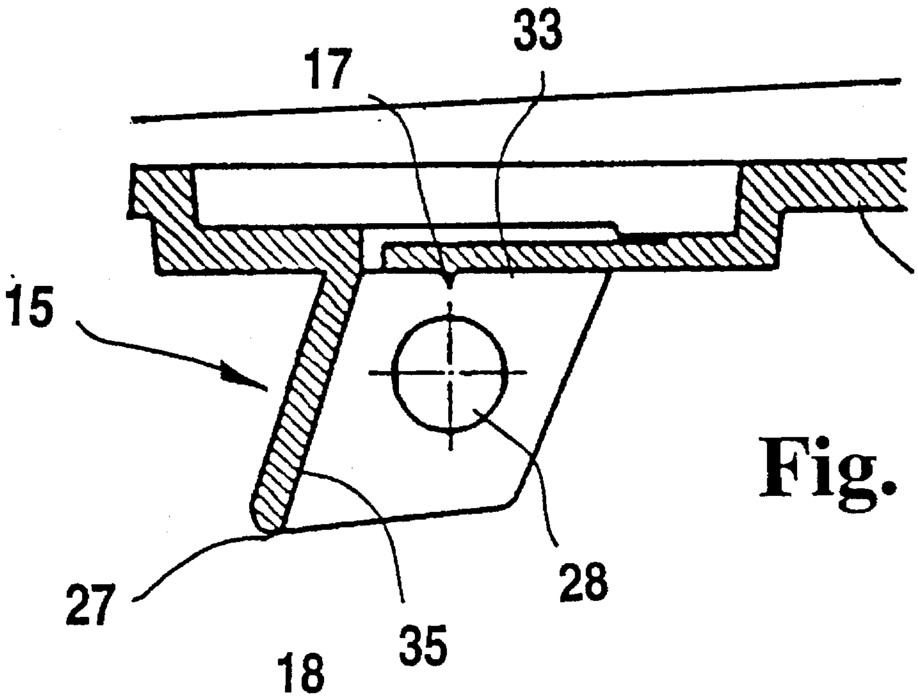
FIG. 8 is an enlarged cross-sectional view of a reinforcement web structure.
Figure 9:
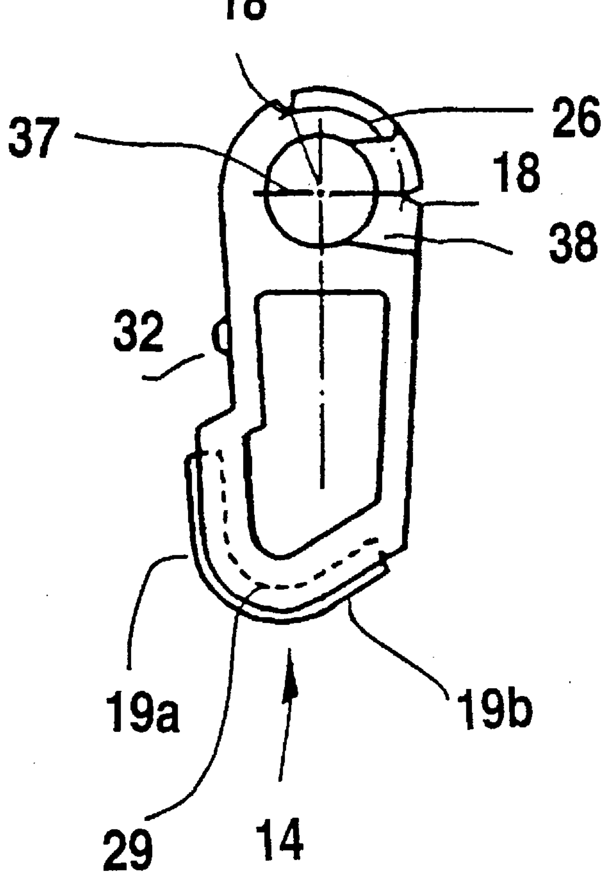
FIG. 9 is a side view of a pivotable housing support leg.

FIGS. 8 and 9 are enlarged representations of a reinforcement web structure 15 with bearing studs 28 and, respectively, a housing leg 14 with a bearing hole 37 adapted to receive the bearing stud 28. The housing leg 14 is provided, at the outer circumference of its mounting area 26 with which it is pivotally supported on the bearing stud 28, with locking grooves 18 which are angularly displaced along the circumference by at least 90° and which are engaged by a locking rib 17 formed on the locking tab 33 of the reinforcement web 15 shown in FIG. 8 in order to fix the pivotable housing leg 14 in its two end positions 14*a* and 14*b* (see FIG. 7). The housing leg is provided with a projection 32 which abuts the inner wall 35 of the reinforcement web 15 when the housing leg 14 is pivoted down. Furthermore, the housing leg 14 is rounded at the support end 29 opposite the bearing cavity 37 and provided with a partial circumferential groove in which a skid resistant bead 19 is disposed. As explained in connection with FIG. 7 the bead 19 is disposed on a keyboard support surface a or b in both lockable end positions 14*a* and 14*b* of the pivotable housing leg 14 thereby providing for good skid resistance of the keyboard.

For mounting a housing leg 14 on a bearing stud 28, the leg is provided at both sides with a wedge-shaped recess 38 whose narrowest inner part is smaller than the diameter of the bearing cavity. With this arrangement, the housing leg can be easily moved in an upwardly tilted position over the bearing stud 28 which then snaps into the bearing cavity 37.

In summary, the arrangement according to the invention provides for a cost-effective increase of the weight of the keyboard and, at the same time, improved bending and twisting resistance in cooperation with the housing legs, that is, their support structure. The metal plate is firmly engaged and no complex reinforcement grooves or ribs are needed for reinforcement of the keyboard housing. Furthermore, the metal plate increases the electromagnetic compatibility if the lower contact foil 3*c* which carries electrical contacts at its underside is pressed onto the metal plate 2.

What is claimed is:

1. A keyboard having a housing top with a key pad and a housing bottom, a key support mat and a multi-layer contact foil set disposed within said housing underneath said key pad, a metal plate embedded in a recess formed in said housing bottom below said contact foil set, said keyboard bottom having integral U-shaped reinforcement webs provided, at their lower ends remote from the housing bottom, with a support surface and having side walls with bearing studs projecting from said side walls toward one another adjacent the housing bottom, and housing legs having at one of their ends bearing cavities receiving said bearing studs so as to be pivotally supported thereby, said housing legs having, at their one ends, outer circular wall portion extending in a partial circle around said bearing cavities and, at their outer circumference adjacent the housing bottom circumferentially spaced locking grooves and said housing bottom having, integrally formed with said housing bottom, resilient locking tabs with locking ribs which are disposed within said U-shaped webs and adapted to engage said locking grooves in said support legs for locking said support legs in their end positions.

2. A key board according to claim 1, wherein said multi-layer contact foil set has a number of openings and said support mat is provided with integral holding elements extending through said openings in the multi-layer contact foil set and engaging the upper side of said metal plate.

3. A keyboard according to claim 2, wherein the housing top of said keyboard is provided at its inner side with ribs of which at least some are disposed on said holding elements.

4. Keyboard according to claim 3, wherein at least some of said ribs of the housing top are engaged by locking elements extending from the housing bottom, said holding elements being disposed directly below the engagement points of said locking elements.

5. A keyboard according to claim 1, wherein only the upper layers of said multi-layer contact foil set are provided with openings and said support mat is provided with integral holding elements which extend through the openings in said upper layers of said multi-layer contact foil set and engage the upper side of the lowermost contact foil for engagement thereof with said metal plate.

6. A keyboard according to claim 5, wherein said lowermost contact foil is provided, at its lower side, with conductor strips or contact points which are in electrical contact with the metal plate beneath.

7. A keyboard according to claim 1, wherein said housing legs have at their ends opposite said bearing cavities support areas with skid-resistant beads, wherein said housing legs have two pivotal end positions which are at least 90° apart and in which said legs are lockable, wherein housing legs are sized and shaped with regard to said reinforcement webs in such a way that, in its inwardly pivoted end position, no part of said leg projects from the bottom of said keyboard further than the support surface of said reinforcement webs but part of said beaded support area is disposed in the same support plane as the support surfaces of said reinforcement webs, and wherein in their outwardly pivoted end positions said support legs project from the housing bottom further than said reinforcement webs.

8. A keyboard according to claim 7, wherein said skid-resistant bead is disposed in a groove extending over the length of the support surface at the opposite end of each support leg and the opposite ends of said legs are shaped so that, in each end position, part of said skid-resistant bead forms that portion of said leg which projects furthest from the housing bottom and which is in contact with a surface on which the keyboard is supported.

9. A keyboard according to claim 1, wherein said housing is provided, adjacent said reinforcement webs, with reinforcement ribs which do not extend therefrom as far as the reinforcement webs to permit grasping the housing and reaching the support legs.

* * * * *